United States Patent
Fong et al.

[11] Patent Number: 6,151,864
[45] Date of Patent: Nov. 28, 2000

[54] SYSTEM AND METHOD FOR TRANSFERRING COMPONENTS BETWEEN PACKING MEDIA

[75] Inventors: Han Chin Fong; Sua Jit Sim, both of Singapore, Singapore

[73] Assignee: Semiconductor Technologies & Instruments, Plano, Tex.

[21] Appl. No.: 09/301,396

[22] Filed: Apr. 28, 1999

[51] Int. Cl.⁷ .......................... B65B 27/00; B65B 43/00; B65B 57/16

[52] U.S. Cl. .................. 53/399; 53/492; 53/55; 53/591; 53/381.1; 53/201; 414/411; 414/416

[58] Field of Search ................. 53/55, 75, 201, 53/247, 244, 251, 252, 381.1, 381.6, 399, 492, 591, 471; 414/411, 416

[56] References Cited

U.S. PATENT DOCUMENTS

| | | | |
|---|---|---|---|
| 4,494,902 | 1/1985 | Kuppens | 414/416 |
| 4,907,701 | 3/1990 | Kobayashi et al. | 414/416 |
| 5,061,144 | 10/1991 | Akimoto et al. | 414/411 |
| 5,308,210 | 5/1994 | Ohtani et al. | 414/416 |
| 5,375,395 | 12/1994 | Gmeiner | 53/251 |
| 5,387,067 | 2/1995 | Grumes | 414/416 |
| 5,479,108 | 12/1995 | Cheng | 414/416 |
| 5,611,193 | 5/1997 | Farrely | 53/252 |
| 5,675,957 | 10/1997 | Kim | 53/246 |
| 5,729,963 | 3/1998 | Bird | 53/471 |
| 5,759,006 | 6/1998 | Miyamoto et al. | 53/244 |

*Primary Examiner*—John Sipos
*Attorney, Agent, or Firm*—Akin, Gump, Strauss, Hauer & Feld, L.L.P.; Christopher J. Rourk

[57] ABSTRACT

A system for transferring components between packing media, such as tube packing media and tape packing media, is provided. The system includes a first packing media handling system, such as a tube handling system. The system also includes a second packing media handling system, such as a tape packing media system. A component handling system can transfer components from the tubes to the taping system, or from the taping system to the tubes.

17 Claims, 7 Drawing Sheets

SYSTEM AND METHOD FOR TRANSFERRING COMPONENTS BETWEEN PACKING MEDIA

BACKGROUND

Semiconductor devices and other discrete circuit components are often packaged in a suitable media for shipping after manufacture. For example, individual semiconductor devices are initially held by loose packing media, such as JEDEC trays, TESEC trays, multi-channel metal magazines, or tubes, and will then be transferred to an immobilizing media, such as a tape media. Tape media typically comprise a first layer of tape on which the semiconductor devices are placed. A second layer of tape is then applied over the first layer of tape, and the two layers of tape are sealed by a suitable mechanism, such as by the application of a vacuum, heat, or pressure. The tape-packaged semiconductor devices are then stored by rolling the tape into a roll. Thousands of semiconductor devices or other components may be shipped using such existing systems and methods.

Regardless of the type of media that are used to loosely pack or to immobilize the devices or components, it is often necessary to transfer the devices or components between the first and second media. Performing such transfers manually is a time-consuming and repetitive process that is not well adapted for human labor. Robotic and automated processes for transferring components from the loose-packing media to the immobilizing media have been implemented and are known in the art.

Nevertheless, it may be necessary on occasion to transfer the semiconductor components from the immobilizing media to the loose packing media, such as when a defect or other anomaly is found to occur in an unacceptable number of semiconductor components or devices. The transfer of components from a tape-based packing media to a loose packing media is then accomplished by manually removing the tape layers from manually-cut sections of the tape packing media, and manual placement of the semiconductor devices or components into the loose packing media. This manual process can be time-consuming and expensive, but there are no known automated or robotic systems that can perform this process automatically.

SUMMARY OF THE INVENTION

Therefore, systems and methods for transferring components between packing media are required that overcome the disadvantages of known systems and methods for transferring components between packing media.

In particular, systems and methods for transferring components between packing media are required that allow the components to be controllably transferred from a first media to a second media, and from the second media to the first media, without significant repetitive manual intervention.

In accordance with the present invention, a system for transferring components between packing media, such as tube packing media and tape packing media, is provided. The system includes a first packing media handling system, such as a tube handling system. The system also includes a second packing media handling system, such as a tape packing media system. A component handling system can transfer components from the tubes to the taping system, or from the taping system to the tubes. For example, the system can receive filled tubes, remove components from the tubes, place the components on the tape, seal the tape, and store empty tubes without manual operator intervention. The system can also receive taped components, remove the top layer of tape, receive an empty tube, fill the tube with components, and store filled tubes without operator intervention. The system can also switch between taping and detaping on command, such that the inadvertent taping of improper components may be stopped, and the improperly taped components may be retrieved without manual operator intervention.

The present invention provides numerous important technical advantages. One important technical advantage of the present invention is a system for transferring components between packing media that allows the transfer to be stopped and reversed at will, so that components may be easily removed from the packaging. In this manner, components may be unpacked if it is determined that damaged or defective components have been inadvertently packaged, that the wrong components have been inadvertently packaged, or for other reasons.

Those skilled in the art will further appreciate the advantages and superior features of the invention together with other important aspects thereof on reading the detailed description which follows in conjunction with the drawing.

DETAILED DESCRIPTION OF PREFERRED EMBODIMENTS

Figure 1:
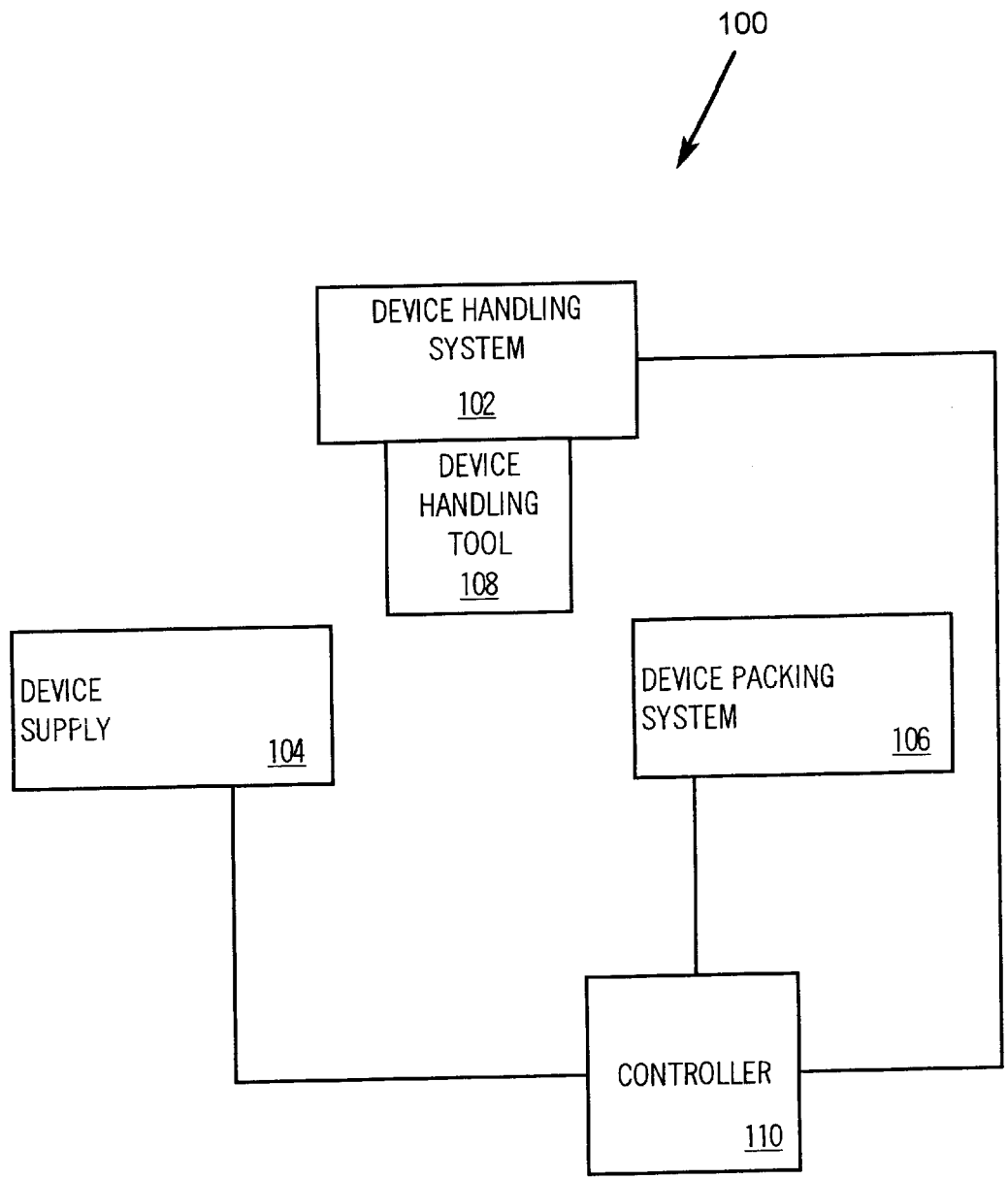
FIG. 1 is a diagram of a packing media transfer system in accordance with an exemplary embodiment of the present invention.

In the description which follows, like parts are marked throughout the specification and drawing with the same reference numerals, respectively. The drawing figures can not be to scale and certain components can be shown in generalized or schematic form and identified by commercial designations in the interest of clarity and conciseness.

FIG. 1 is a diagram of a packing media transfer system 100 in accordance with an exemplary embodiment of the present invention. Packing media transfer system 100 may be used to place semiconductor devices, discrete electronic components, circuit packages, or other items from a first packing media into a second packing media. Packing media transfer system 100 is operable to place loosely-packed devices or components into a fixed media, or to remove devices or components from fixed packing media and place them back into a loose packing media. For example, packing media transfer system 100 may transfer devices or components from a loose packing media, such as tubes, JEDEC trays, TESEC trays, multi-channel metal magazines, or other suitable loose packing media, into a taping system or other suitable fixed packing media that securely holds the devices or components. Packing media transfer system 100 may also transfer the devices or components back to the loose packing media from the fixed packing media.

Packing media transfer system 100 includes device handling system 102, device supply system 104, and device packing system 106, which are each coupled to controller 110. Device handling system 102 further includes device handling tool 108. Device handling tool 108 is typically used to remove devices or components from device supply system 104 and to place the devices or components onto device packing system 106, but may also be used to remove devices or components from device packing system 106 and to transfer the devices or components to device supply system 104. Controller 110 is operable to control the components of packing media transfer system 100 such that they work together in a coordinated fashion to allow devices or components to be transferred between packing media, as required.

Device supply system 104 is a packing media handling system that typically provides devices or components for packing, but which may also receive devices or components after unpacking. For example, device supply system 104 may receive tubes containing loosely-packed devices or components, and may provide individual devices or components for processing by device handling system 102. Likewise, device supply system 104 may receive individual devices or components from device handling system 102 and place them into suitable packing media. For example, device supply system 104 may handle tubes, JEDEC trays, TESEC trays, multi-channel metal magazines, taping systems, or other suitable types of semiconductor device loose or immobilizing packing media.

Device packing system 106 is a packing media handling system that typically receives individual devices or components from device handling system 102 and packs the devices or components in a suitable packing media, but which may also unpack the devices and components for transfer to device handling system 102. For example, device-packing system 106 may apply a top and bottom layer of vacuum-, heat-, or pressure-sealed tape to the device. Device packing system is also operable to unpack devices or components from packing media, such as by removing a top layer of tape from taped devices or components, so as to allow the devices or components to be handled and removed by device handling system 102. Device packing system 106 is configured to immobilize the devices or components while the tape is being applied or removed. In this manner, device packing system 106 may receive devices or components from device handling system 102 and align them on the bottom layer of tape, such an embossed tape having a channel for receiving devices or components, or in other packing media, and subsequently apply the top layer of tape, such as a cover tape, and seal the package or otherwise seal the packing media. Device packing system 106 can also remove the top layer of tape such as by peeling the layer off and can position the devices or components for removal by device handling system 102.

Device handling system 102 and device handling tool 108 are component handling systems that are configured to controllably move devices or components in a predetermined manner. For example, device handling system 102 and device handling tool 108 may include one or more photo sensors that are used to detect devices or components, or cameras/sensors that are operable to focus on devices or components at predetermined locations of device supply system 104 and device packing system 106. Controller 110 is operable to process data from such photo sensors or cameras of device handling system 102 so as to place the device-handling tool 108 on the semiconductor device or other component at a predetermined position. Device handling tool 108 is then used to pick up the semiconductor device, move it to a predetermined location, and release the semiconductor device. Device handling system 102 and device handling tool 108 may be a robotic assembly that utilize a suitable physical principal for transporting the devices or components, including a robotic gripper tool, a suction device, a vacuum device, or other suitable devices.

Controller 110 is coupled to device supply system 104, device packing system 106, and device handling system 102. As used in this application, the term "couple" may refer to a physical connection, such as a data bus or coaxial cable, a virtual connection, such as randomly-assigned memory locations in a data memory, a logical connection, such as through logical gates of a semiconductor device or other component, or other suitable connections. Controller 110 may include a general purpose computing platform such as a Pentium microcomputer, or other suitable computing platforms. Controller 110 also includes suitable hardware, software, or a suitable combination of hardware and software that allow controller 110 to control the operation of the other systems and components of packing media transfer system 100.

In operation, packing media transfer system 100 is used to pack or unpack devices or components so that they may be shipped to end users or received back from end users. In one exemplary embodiment, packing media transfer system 100 may be used primarily to place loosely-packed devices or components within a top and bottom layer of tape, and to seal the tape so that the devices or components may be shipped to an assembler for inclusion in a consumer device. In practice, such devices or components may inadvertently include misoperating components, such that the batch of devices or components must be de-taped for subsequent testing of the devices or components. Packing media transfer system 100 allows taped semiconducting packages to be detaped and repackaged in loose packing media so that the devices or components may be subsequently tested for anomalies.

Likewise, packing media transfer system 100 may be used to transfer devices or components between packing media, as suitable. In other exemplary embodiments, packing media transfer system 100 may be used to transfer devices or components from tubes to JEDEC trays, from tape packaging to tubes, from tape packaging to tape packaging, or between other suitable packing media. Packing media transfer system 100 may likewise be used in conjunction with automated test equipment, such that the devices or components are removed from packing media, tested, and returned to packing media upon the successful completion of testing.

Figure 2:
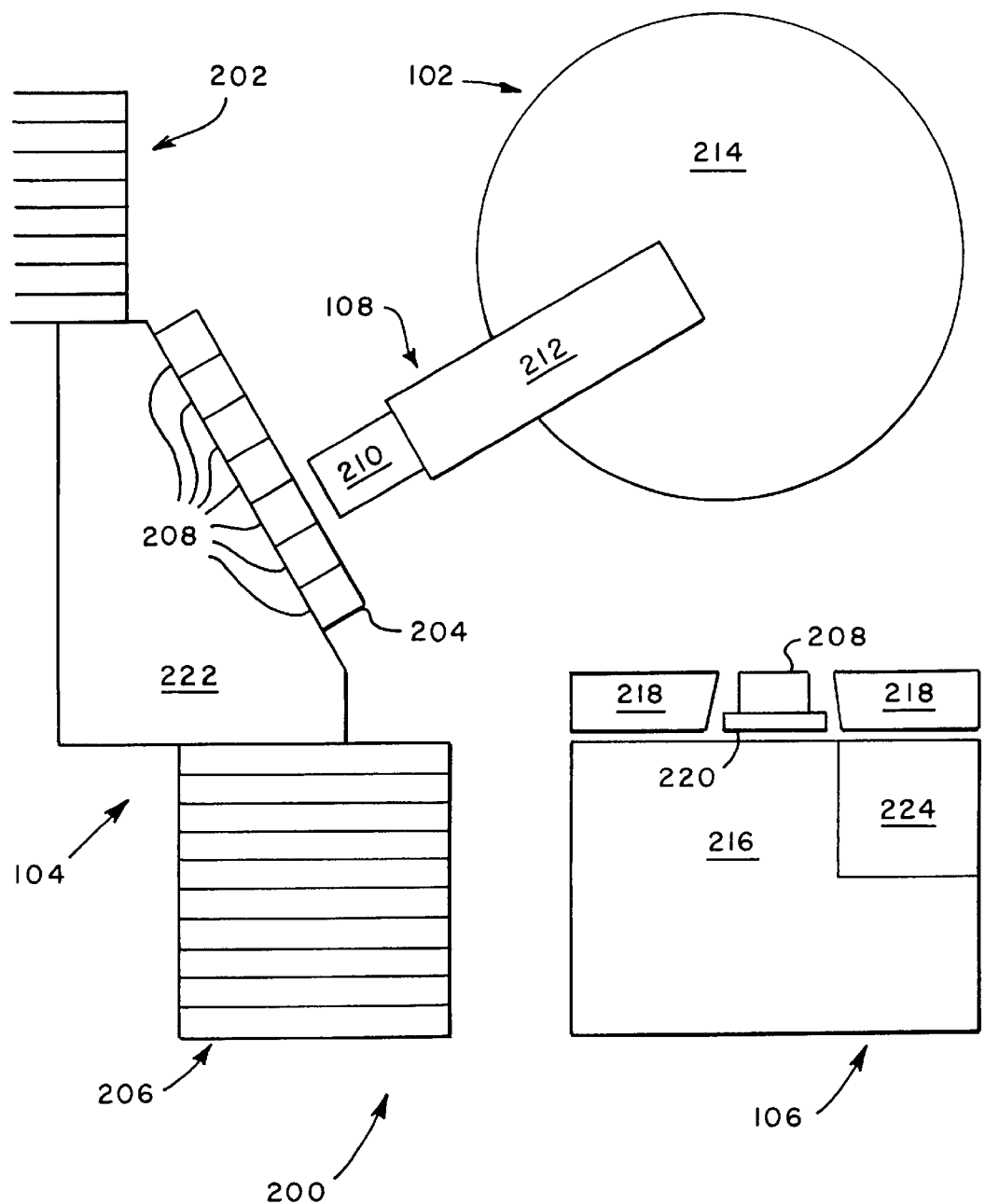
FIG. 2 is a side view of a packing media transfer system in accordance with an exemplary embodiment of the present invention.

FIG. 2 is a diagram of a packing media transfer system 200 in accordance with an exemplary embodiment of the present invention. Packing media transfer system 200 may be used to transfer semiconductor devices or other components from loose packing media to a taped media, and to conversely move the devices or components from the taped media to loose packing media.

Packing media transfer system 200 includes loose storage media supply 202, loose media 204, and devices/components 208. Each unit of loose media 204 includes a plurality of devices/components 208. Packing media transfer system 200 also includes empty packing media cache 206, which receives empty loose media 204 from packing media support 222. A separate cache may also be provided that is used to hold empty tubes or other loose storage media for detaping, in the event that detaping is required for taped devices or components that have been previously taped. The relative locations of the empty and full tube caches may be suitably altered, and are exemplary as shown.

Packing media transfer system 200 further includes pick and place head 210, which is mounted on the end of controller arm 212. Controller arm 212 is held by controller arm support 214, which is part of device handling system 102. Pick and place head 210, controller arm 212, and controller arm support 214 are a robotic assembly that is used to transfer devices or components between a first packing media and a second packing media. Other suitable systems, mechanisms or robotic assemblies may also or alternatively be used.

In addition, packing media transfer system 200 includes side supports 218 which are movable supports on base 216. Tape media 220 is also supported by base 216. Devices/components 208 are removed from loose media 204 by pick and place head 210 of controller arm 212, for subsequent transfer to tape media 220. Side supports 218 and base 216, in conjunction with tape features such as embossing or cavities, form a device or component immobilizing system that prevents devices or components from moving when the second tape layer is applied or removed. Other suitable component immobilizing systems may also be used. A packing system 224 is used to apply a vacuum, heat, pressure, or other suitable physical mechanism after the two layers of tape have been positioned around the components, thus causing the tape layers to seal against each other and hold the device or component.

In operation, pick and place head 210 of controller arm 212 is used to pick up individual devices/components 208 and move them from a first media, such as loose media 204, to a second media, such as tape media 220. Pick and place head 210 may also be used to remove devices/components 208 from tape media 220 to loose media 204. In this manner, devices or components may be moved between shipping media, so as to efficiently place the devices or components into predetermined shipping media. For local transportation such as during manufacturing, loose shipping media such as trays or tubes are sufficient. Alternatively, if devices or components must be shipped long distances, it may be necessary to immobilize them so that they do not become damaged in transit. These devices or components may be immobilized using a taping system, such as that shown in FIG. 2.

After the devices or components have been packaged in an immobilizing media, it may be necessary to remove some or all of the devices or components and place them back into a loose packing media. For example, the assembler that receives the devices or components may have loose packing media that are used to store and move the devices or components while they are being prepared for assembly. Likewise, the assembler or packager may determine that there are an unacceptable number of components or devices that do not meet specified requirements, and may desire to unpack the packed components for subsequent testing. Packing media transfer system 200 may be used to automatically remove the devices or components from the immobilizing media and to place the devices or components into a loose packing media for subsequent testing.

Testing may likewise be performed after the device or component is removed from the first media and before it is placed in the second media, such as functional testing, visual inspection, or other suitable tests. Packing media transfer system 200 may be used to readily accomplish these and other useful objectives.

Figure 3:
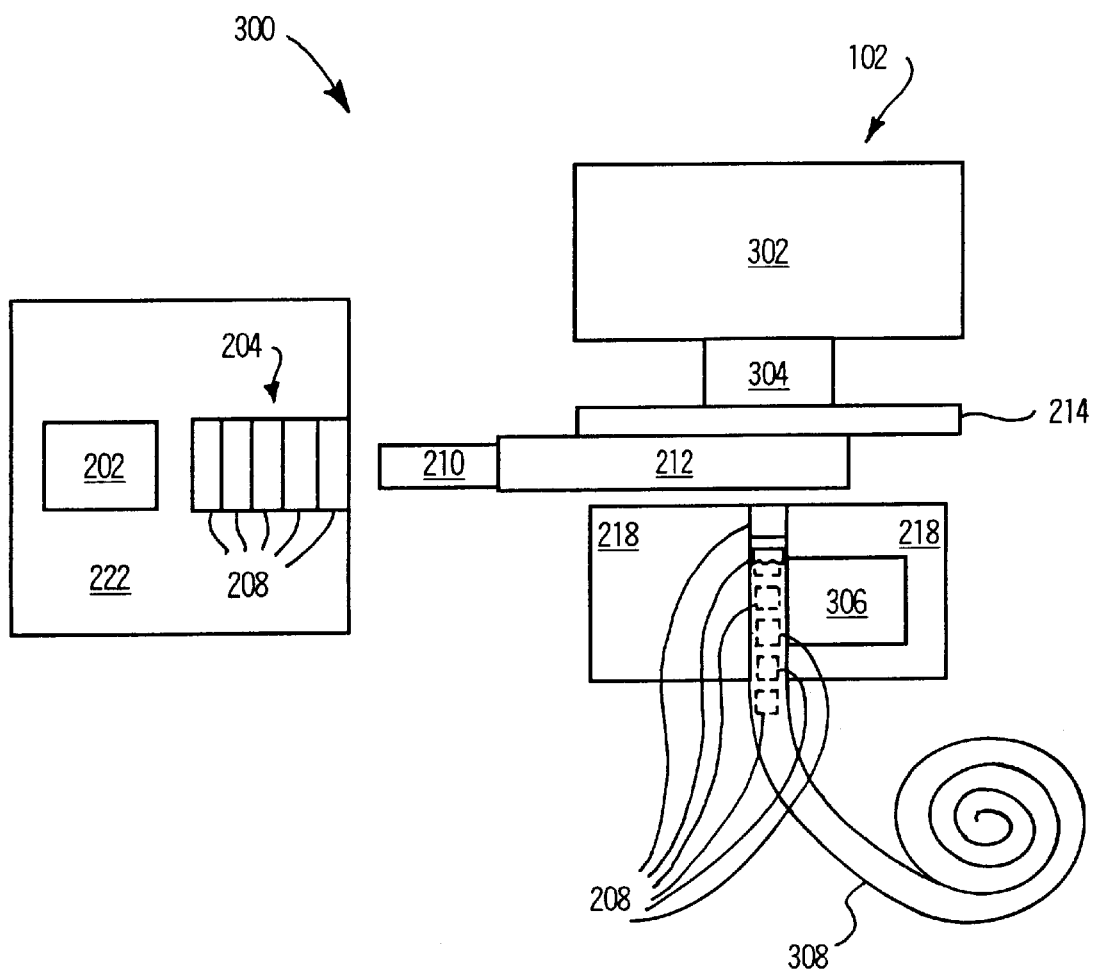
FIG. 3 is an overhead view of a packing media transfer system in accordance with an exemplary embodiment of the present invention.

FIG. 3 is a diagram of a packing media transfer system 300 in accordance with an exemplary embodiment of the present invention. Packing media transfer system 300 is used to transfer devices or components from a first packing media to a second packing media.

Packing media transfer system 300 includes device handling controller 302 and controller arm support 304, which are coupled to controller arm support 214. Device handling controller 302 is operable to control the rotation of controller arm support 304, such that pick and place head 210 of controller arm 212 may be rotated between loose media 204 and device handling system 102. After a device/component 208 is removed from loose media 204 and is placed on taping base 306, sides supports 218 are used to immobilize the device while upper layer tape system 306 applies a second layer of tape onto the device. The upper and lower tape segments are then sealed by a suitable mechanism, such as by a vacuum, heat, or pressure, such that the semiconductor packages are immobilized within.

In operation, pick and place head 210 swivels in a rotating manner between loose media 204 and tape packing media 308. Discrete devices/components 208 are placed on a bottom layer of tape packing media 308, which is typically embossed or contains pockets or other similar features, and a top layer of tape is used to cover the tape packing media 308. The top layer of tape may likewise be removed at any point in time so that pick and place head 210 may be used to remove device/component 208 and place it back in loose media 204. Packing media transfer system 300 is used in one exemplary embodiment primarily to transfer loosely-packed devices or components to an immobilizing media, but may also be used in other embodiments to transfer loosely-packed devices or components to other loose media, to test loosely-packed devices or components as they are being transferred between media, or in other suitable manners.

Figure 4:
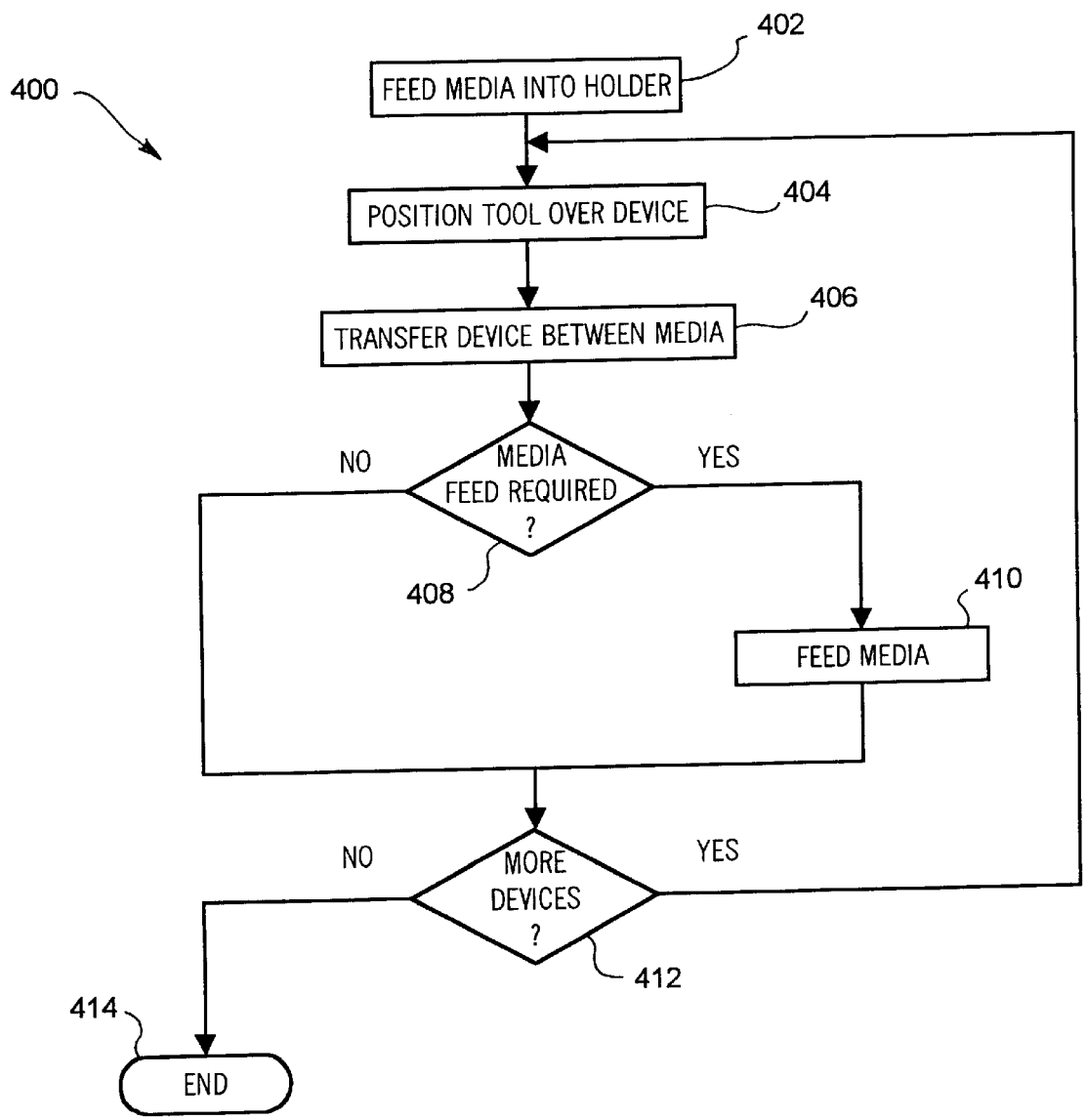
FIG. 4 is a flowchart of an exemplary method for handling semiconductor components.

FIG. 4 is a flowchart of an exemplary method 400 for handling semiconductor devices or other components. Method 400 begins at step 402, where packing media are fed into a holder. For example, a user-entered "pack" command may be received that causes the devices or components to be transferred from a loose packing media to an immobilizing packing media. Thus, loose packing media bearing devices or components will be fed into a loose packing media holder, and empty immobilizing media will be fed into an immobilizing packing media holder. Alternatively, a user-entered "unpack" command may be received, such that immobilizing media bearing devices or components are fed into an immobilizing packing media holder, and empty loose packing media are fed into a loose packing media holder. After the packing media are fed into a holder at step 402, the method then proceeds to step 404.

At step 404, a component handling tool is positioned over the next device to be moved. For example, the devices or components may be contained within a section of tubing, such that the device that is at the bottom of the tubing is always the next device to be moved. Likewise, the devices or components may be contained within packing tape from which a top sealing layer of tape has been removed. A camera/sensor and associated control systems may be used to ensure that a device has advanced or fallen into the proper location, and that the component handling tool is positioned over the device. Other suitable systems and methods for positioning the tool over the device may be used.

At step 406, the component or device is transferred between packing media. For example, the components or devices may be transferred from loose packing media to immobilizing media, from loose packing media to other loose packing media, or from immobilizing media to other immobilizing media. Testing may also be performed during the transfer process, such as visual inspection, functional testing, or other suitable testing. Transfer may be in the same direction as the previous transfer, or may be in the opposite direction from the previous transfer, such that the component that was previously transferred is now returned. The method then proceeds to step 408.

At step 408 it is determined whether the packing media must be fed. For example, if the packing media is tape media, it may be necessary to advance or reverse the tape media by an amount equal to the storage space required for a single semiconductor device. Alternatively, if the packing media is a gravity-fed loose media tube, it will only be necessary to feed media when that tube is empty or full, depending on the mode of operation. If media feed is required, the method proceeds to step 410 and the media feed is performed. If no media feed is required, the method proceeds to step 412.

At step 412, it is determined whether more devices or components need to be packed or unpacked. If additional devices or components require packing or unpacking, the method returns to step 404. Otherwise, the method proceeds to step 414 and terminates. In this manner, packing or unpacking may continue as long as there are components or devices that need to be packed or unpacked.

In operation, method 400 is used to transfer devices or components between packing media. For example, method 400 may be used to remove devices or components from loose packing media such as tubes and to place the devices or components onto a taping mechanism for subsequent taping. Alternatively, method 400 may be used to remove the semiconducting components from vacuum-taped shipping media and to place the components into a loose packing media such as tubes. Other suitable transfers may be performed by method 400, and intermediate testing steps may be added during transfer so as to allow the components or devices to be tested as they are transferred from the packing media.

Figure 5:
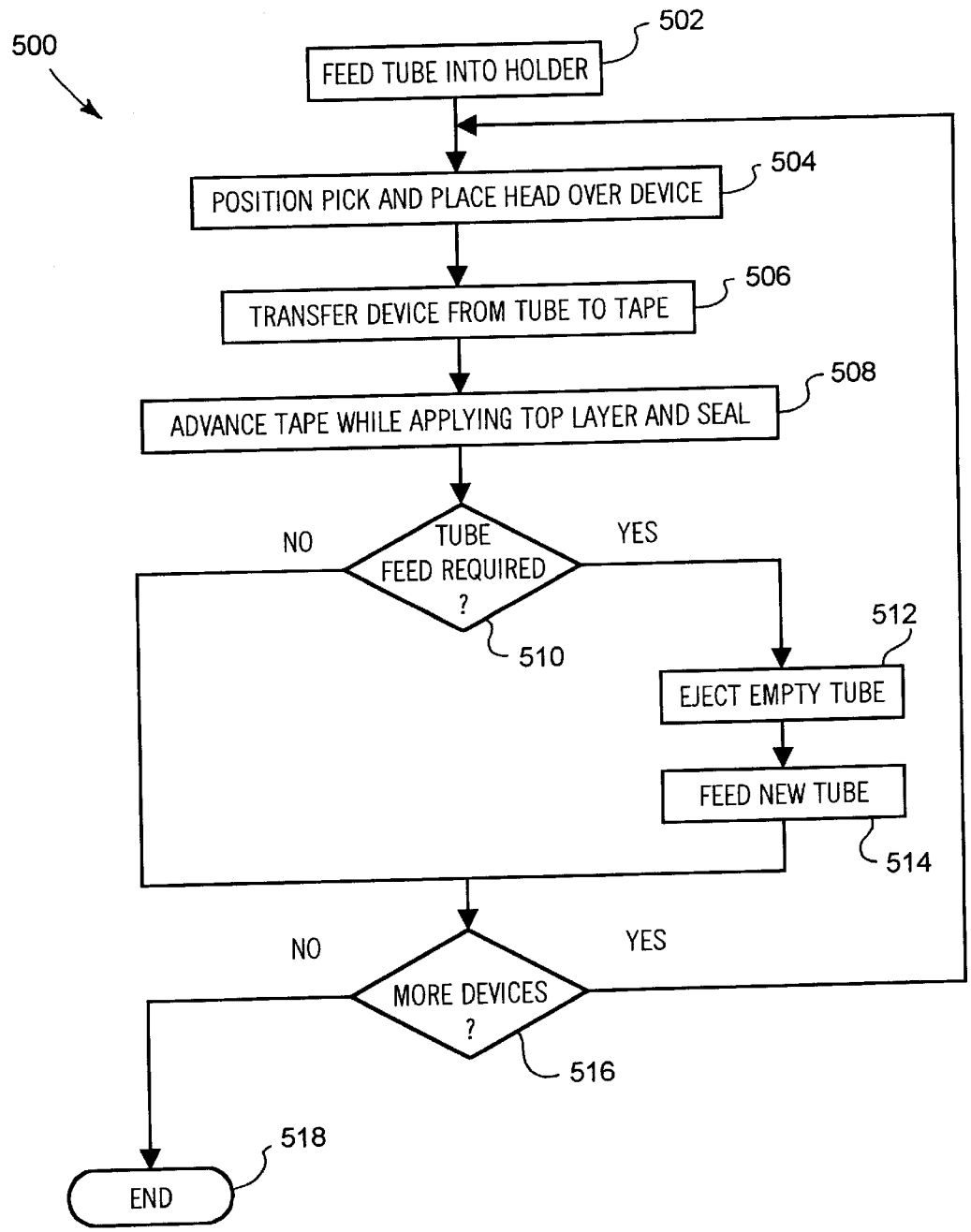
FIG. 5 is a flowchart of an exemplary method for transferring semiconductor components from a loose packing media to a fixed packing media.

FIG. 5 is a flowchart of an exemplary method 500 for transferring semiconducting components from a loose packing media to a fixed packing media. Method 500 begins at step 502, where a tube holding loose-packed devices or components is fed into a tube holder. For example, the tube may be held in a tube hopper, which holds a plurality of tubes bearing loose-packed devices or components. The bottom-most tube from the hopper may be extracted and automatically fed into a holder. Other loose-packing media may also be used, such as JEDEC trays, TESEC trays, or similar media. The method then proceeds to step 504.

At step 504, a pick and place head is positioned over a predetermined device in the tube. For example, if the tube is held at an angle, the devices or components may be gravity-fed to a bottommost location. The pick and place head may be used to remove the bottommost semiconducting component so that the remaining semiconducting components are also gravity-fed to the bottom of the tube. After the pick and place head is positioned at step 504, the method proceeds to step 506 where the pick and place head is used to transfer the device from the tube to a bottom layer of tape, which, for example, may be embossed, have pockets, or have other features that allow it to be indexed and to aid in placement of the device or component. The pick and place head may be, for example, a vacuum-activated device that holds the semiconducting component using vacuum pressure. After the device has been transferred to the tape at step 506, the method proceeds to step 508.

At step 508, the tape is advanced while a top tape layer is applied. For example, the top and bottom layers of tape may be subjected to a vacuum, such that they are caused to sealably hold against the opposing layer of tape. The tape may also be heat activated, so as to seal against the opposing layer of tape when exposed to heat, or may have a pressure-sensitive adhesive so as to seal when pressure is applied. Other processes may likewise be used to seal the tape. Semiconductor devices or other components placed between the tape layers are thus packaged in a manner that prevents them from moving without causing damage or other detrimental affects. After the tape is applied to the device or component at step 508, the method proceeds to step 510.

At step 510, it is determined whether tube feed is required. For example, if the last semiconductor device or other component has been removed from the tube that is presently in the tube holder, it will be necessary to place a new tube with a full set of components or devices in the tube holder. If it is determined at step 510 that tube feed is required, the method proceeds to step 512 where the empty tube is ejected. For example, the empty tube may be fed into an empty tube cache, or other suitable empty tube processing devices. The method then proceeds to step 514, where a new tube is fed into the tube holder, and the method proceeds to step 516.

At step 516, it is determined whether there are additional devices or components to be removed from the tube and placed in the taping mechanism. If there are more devices or components, the method returns to step 504, otherwise, the method proceeds to step 518 and terminates.

In operation, method 500 is used to transfer devices or components from a loose packing media, such as a tube, to an immobilizing media, such as tape media, for subsequent shipment. Method 500 is used to package semiconductor devices or components in a manner that reduces the risk of damage during shipment.

Figure 6:
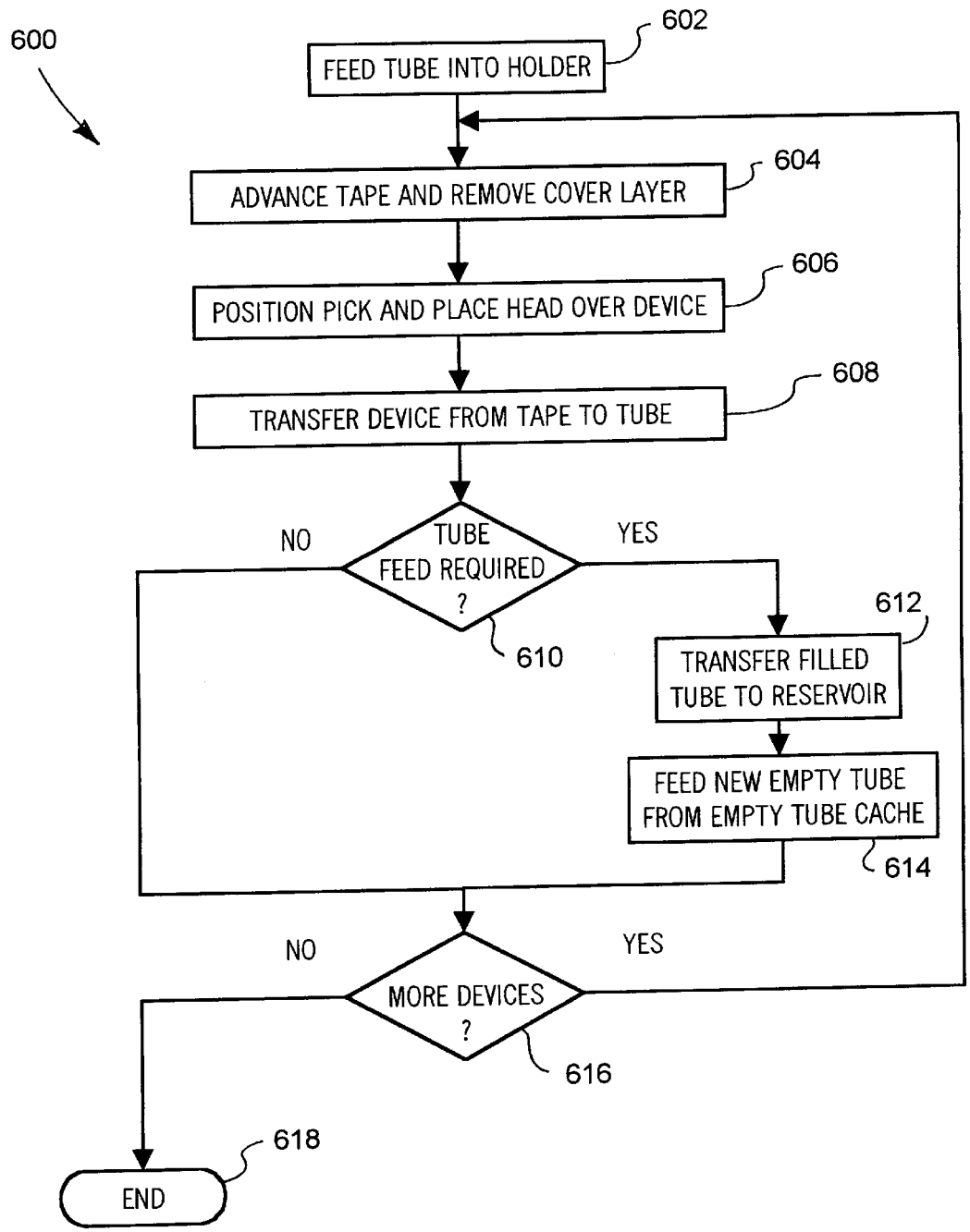
FIG. 6 is a flowchart of an exemplary method for transferring semiconductor components from a fixed packing media to a loose packing media.

FIG. 6 is a flowchart of an exemplary method 600 for transferring semiconductor devices or other components from taped packing media to a loose packing media, which is commonly referred to as a detaping procedure.

Method 600 begins at step 602 where an empty packing tube or other suitable loose-packing media is fed into the tube holder. The method then proceeds to step 604 where the packing tape is advanced and the top tape cover layer is removed. After the top tape layer is removed so that the semiconductor device or other component is exposed, the method proceeds to step 606, where a pick and place head is positioned over the device or component. The method then proceeds to step 608, where the pick and place head is used to transfer the device or component from the tape to the tube. For example, if the pick and place head uses a vacuum mechanism for holding the device or component, a vacuum is applied so that the device or component may be held by the pick and place head.

At step 610, it is determined whether a tube feed is required. For example, once a tube has been filled with a predetermined number of semiconducting components, it will be necessary to place the empty tube in the tube holder for additional components. If it is determined at step 610 that tube feed is required, the method proceeds to step 612 where the filled tube is transferred to the filled tube reservoir. For example, the filled tube reservoir may hold previously-filled tubes of semiconducting components. Storage of tubes in the filled tube reservoir may also require that end caps be placed on the tubes, or that other suitable methods be used to prevent the semiconducting components from spilling out of the tube.

After the filled tube has been transferred at step 612, the method proceeds to step 614 where a new empty tube is fed into the tube holder, such as from an empty tube cache. The method then proceeds to step 616 where it is determined whether there are more devices or components to be detaped. If it is determined at step 616 that additional devices or components must be detaped, the method returns to step 604. Otherwise, the method proceeds to step 618 and terminates.

In operation, method 600 is used to transfer devices or components from an immobilizing media, such as tape media, into a loose packing media, such as a tube, typically for subsequent handling. Method 600 is used to unpack semiconductor devices or components in a manner that allows them to be shipped in a manner that reduces the risk damage.

Figure 7:
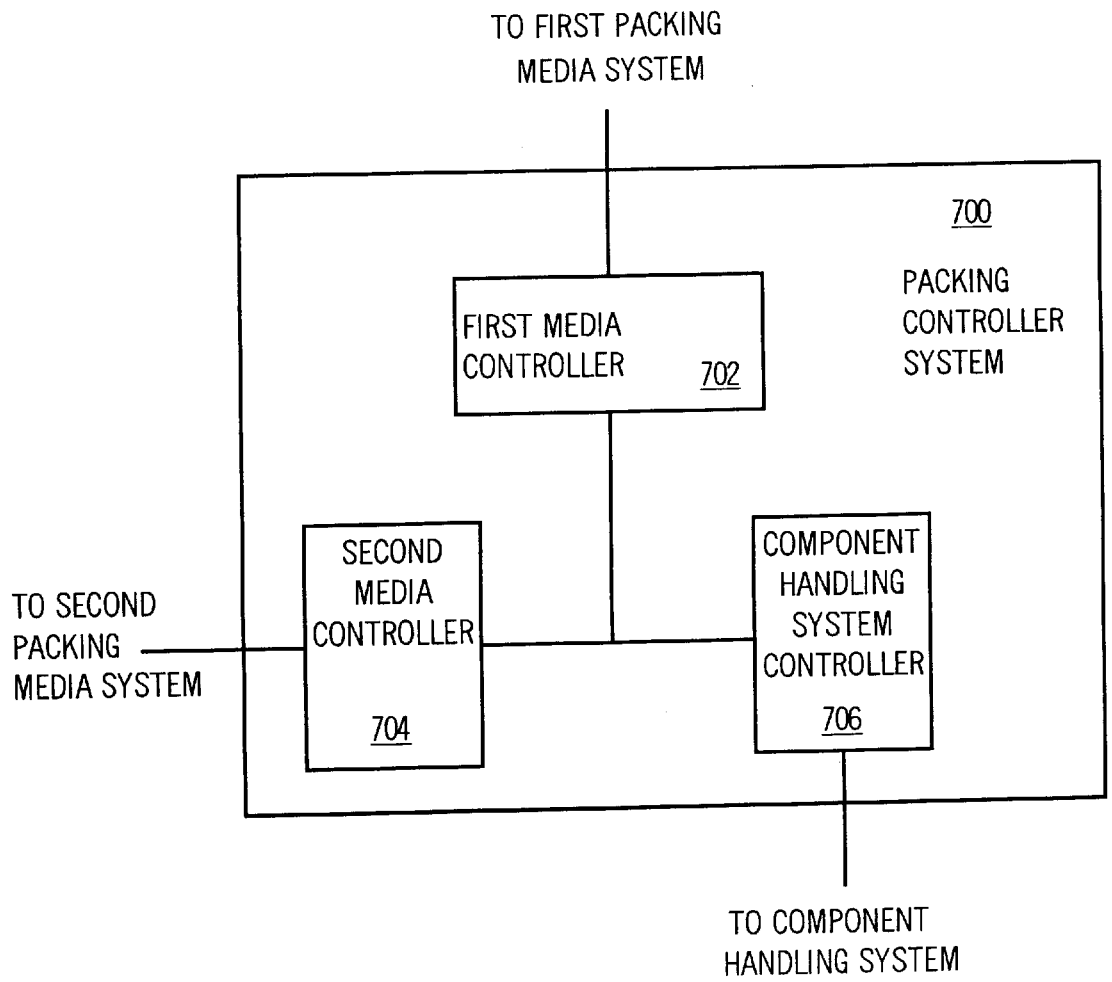
FIG. 7 is a block diagram of a packing controller system in accordance with an exemplary embodiment of the present invention.

FIG. 7 is a block diagram of a packing controller system 700 in accordance with an exemplary embodiment of the present invention. Packing controller system 700 includes first media system controller 702, second media system controller 704, and component handling system controller 706. Packing controller system 700 may be implemented in hardware, software, or a suitable combination of hardware and software, but is preferably software that operates on a general purpose computing platform, such as a Pentium processor.

First media system controller 702 is operable to control a first packing media system. For example, first media system controller 702 may be a tube packing media controller that advances a filled tube bearing devices or components from a tube hopper into a tube holder. After all of the devices or components have been removed from the tube, first media system controller 702 ejects the empty tube into a tube cache, and advances another filled tube into the tube holder. Likewise, first media system controller 702 retrieves an empty tube from the tube cache and advances the empty tube into the tube holder. After the empty tube has been filled, first media system controller 702 advances the filled tube into the tube hopper, and advances another empty tube from the tube cache into the tube holder. Although a tube packing media system has been described, first media system controller 702 may be used to control JEDEC trays, TESEC trays, multi-channel metal magazines, tape packing systems, or other suitable packing media.

First media system controller 702 may accomplish the transition from packing mode to unpacking mode at any suitable time. Thus, if a tube packing media system is being controlled, the transition from packing mode to unpacking mode may be accomplished when the tube is completely filled, completely empty, or only partially filled.

Second media system controller 704 operates in a manner similar to that of first media system controller 702. In one exemplary embodiment, second media system controller 704 is implemented by the same software systems that are used to implement first media system controller 702. In another exemplary embodiment, second media system controller 704 controls a tape media system that advances a first layer of tape so as to create a space on the tape for a semiconductor device or other component. After a semiconductor device has been placed on the first layer of tape, second media system controller 704 advances the first layer of tape, applies a second layer of tape, and seals the two tape layers by a suitable process, such as by applying a vacuum, heat, pressure, or other suitable processes.

In an unpacking mode of operation, second media system controller 704 removes the second sealed layer of tape so as to expose a previously immobilized device. After the device has been removed, second media system controller 704 advances the tape and removes the second layer so as to expose another semiconductor device. Although a tape packing media system has been described, second media system controller 704 may be used to control JEDEC trays, TESEC trays, multi-channel metal magazines, tube packing systems, or other suitable packing media. Second media system controller 704 may accomplish the transition from packing mode to unpacking mode at any suitable time. Thus, if a tape packing media system is being controlled, the transition from packing mode to unpacking mode may be accomplished such that devices or components that have just been added to the tape may be removed.

First media system controller 702 and second media system controller 704 are each coupled to component handling system controller 706. Component handling system controller 706 is operable to identify the location of components that have been stored in the first media system and the second media system, and to cause individual components to be transferred from the first media system to the second media system or from the second media system to the first media system.

For example, component handling system controller 706 may receive image data that indicates the location of a component in a first packing media, and may cause a robotic tool or other device to pick up the component from the first packing media and to place the component in the second packing media. Component handling system controller 706 may then transmit data to first media handling system 702 and second media handling system 704 to cause the media to be advanced, such that another component may be transferred between media.

First media system controller 702, second media system controller 704, and component handling system controller 706 may be a central system that is coupled to a first media handling system, a second media handling system and a component handling system, or may be discrete systems implemented on processors contained within each of the three systems. For example, first media system controller 702, second media controller system 704, and component handling system controller 706 may have internal data processing equipment, and may be operable to control the subcomponents and devices of each corresponding system. Likewise, the three systems may be "dumb" systems without internal data processing equipment, and may require operating instructions from a central platform on which packing controller system 700 is implemented. The systems may also have redundant processing capability, such that the functions of first media system controller 702, second media controller system 704, and component handling system controller 706 may be performed by any of the three systems in the event that the processing capabilities of the other two systems fail.

In operation, packing controller system 700 is used to control two packing media systems and a component handling system, such that the components may be transferred from a first packing media to a second packing media, and from the second packing media to the first packing media. The transition from the first to second packing media process to the second to first packing media process may be performed whenever suitable, such that devices or components may be packed or unpacked upon receipt of a single command or other indication, without additional manual operator intervention.

Although preferred and exemplary embodiments of systems and methods for controlling communications medium access have been described in detail herein, those skilled in the art will also recognize that various substitutions and modifications can be made to the systems and methods without departing from the scope and spirit of the appended claims.

What is claimed is:

1. A system for transferring components between packing media comprising:
   a packing media handling system;
   a tape packing media handling system;
   an upper layer tape system for controllably applying and removing an upper tape layer;
   a component handling system transferring components between the packing media handling system and the tape packing media handling system; and
   a controller causing the handling system to transfer components from the packing media handling system to the tape packing media handling system when the upper layer tape system is applying the upper tape layer, and to transfer components from the tape packing media handling system to the packing media handling system when the upper layer tape system is removing the upper tape layer.

2. The system of claim 1 wherein the packing media handling system comprises a tube-based semiconductor device packing media handling system.

3. The system of claim 1 wherein the packing media system comprises a tray-based semiconductor device packing media system.

4. The system of claim 1 wherein the packing media system comprises a loose semiconductor device packing media system.

5. The system of claim 1 wherein the component handling system further comprises a robotic assembly.

6. The system of claim 1 wherein the component handling system further comprises a device that uses a vacuum to hold one or more semiconductor devices.

7. The system of claim 1 wherein the controller is coupled to the packing media handling system, the tape packing media handling system, and the component handling system, and the controller coordinates the operation of the systems so as to controllably transfer semiconductor devices from the packing media handling system to the tape packing media handling system and from the tape packing media handling system to the packing media handling system.

8. The system of claim 1 further comprising a component test system coupled to the component handling system, the component test system performing predetermined tests on each component as they are being transferred from the packing media system to the tape packing media system.

9. The system of claim 1 wherein the packing media handling system comprises:
   a tube hopper holding a plurality of tubes, each tube containing a plurality of semiconductor devices;
   a tube holding system coupled to the tube hopper, the tube holding system receiving a tube from the tube hopper and to hold the tube while semiconductor devices are removed from the tube;
   a tube cache coupled to the tube holding system, the tube cache holding a plurality of empty tubes; and
   wherein the tube holding system further receives a tube from the tube cache, holds the tube while semiconductor devices are placed in the tube, transfers empty tubes to the tube cache after all semiconductor devices have been removed from the tube, and transfers full tubes to the tube hopper after all semiconductor devices have been placed in the tube.

10. The system of claim 1 further comprising a sealing system operable to apply a sealing mechanism to a lower tape layer and the upper tape layer so as to cause the lower tape layer and the upper tape layer to seal around a semiconductor device disposed between the lower tape layer and the upper tape layer.

11. An apparatus for transferring components between packing media comprising:
   a tube hopper holding a plurality of tubes, each tube containing a plurality of semiconductor devices; a tube holding system coupled to the tube hopper, the tube holding system receiving a tube from the tube hopper and holding the tube while semiconductor devices are removed from the tube;
   a tube cache coupled to the tube holding system, the tube cache holding a plurality of empty tubes;
   wherein the tube holding system receives a tube from the tube cache and holds the tube while semiconductor devices are placed in the tube, transfers empty tubes to the tube cache after all semiconductor devices have been removed from the tube, and transfers full tubes to the tube hopper after all semiconductor devices have been placed in the tube;
   a first tape layer handling system;
   a second tape layer handling system;
   wherein the second tape layer handling system applies the second tape layer over the first tape layer after a semiconductor device has been placed on the first tape layer, and removes the second tape layer so as to expose the semiconductor device when the semiconductor device is to be removed from the first tape layer;
   a robotic assembly having a semiconductor device handling tool that uses a vacuum to hold one or more semiconductor devices, the robotic assembly removing semiconductor devices from the tube in the tube holding assembly and placing them on the first tape layer, the robotic assembly further removing semiconductor devices from the first tape layer and lacing them in the tube of the tube holding assembly; and
   a controller coupled to the tube hopper, the tube holding system, the tube cache, the first tape layer handling system, the second tape layer handling system, and the robotic assembly, the controller causing the robotic assembly to pick up semiconductor devices from the first tape layer and to place them in tubes of the tube holding assembly after an unpack command has been received, the controller further causing the robotic assembly to pick up semiconductor devices from the tube of the tube holding assembly and to place them on the first layer of tape after a pack command has been received.

12. A method for handing semiconductor devices comprising:
   receiving a user-entered command at a controller unit to pack or unpack the semiconductor devices;
   transferring the semiconductor devices from a first packing media to a second packing media or from a second packing media to a first packing media in response to the packing or unpacking command, respectively;

testing the transferred semiconductor devices;

receiving an unpack or pack command in the controller unit, respectively, in response to the testing; and transferring said tested semiconductor devices from the second packing media to the first packing media or from the first packing media to the second packing media, respectively, in response to the pack or unpack command, such that the pack and unpack commands can be interrupted with an unpack and a pack command, respectively, and the tested semiconductor devices that were previously transferred between the first and second media will be transferred back.

13. The method of claim 12 wherein transferring components from the first packing media to the second packing media comprises transferring components from a tube-based packing media to a tape-based packing media.

14. The method of claim 12 wherein transferring components from the first packing media to the second packing media further comprises:

receiving a tube containing one or more semiconductor devices from a tube hopper;

transferring each semiconductor device from the tube to a tape-based packing media;

transferring the tube to a tube cache after all of the semiconductor devices have been removed from the tube; and advancing the tape of the tape-based packing media so as to allow additional semiconductor devices to be placed on the tape-based packing media.

15. The method of claim 12 wherein transferring components from the second packing media to the first packing media further comprises:

removing a second layer of tape from tape-stored semiconductor devices so as to expose one or more of the semiconductor devices;

transferring an empty tube from a tube cache to a tube holding system;

transferring semiconductor devices from the tape storage media to the tube; and transferring the tube to a tube reservoir when the tube is full.

16. A method for handing semiconductor devices comprising:

receiving a user-entered command at a controller unit to pack the semiconductor devices;

transferring the semiconductor devices from a packing media to a tape packing media;

sealing the tape packing media;

receiving an unpack command at the controller;

unsealing the tae packing media; and transferring the semiconductor devices from the tape packing media to the packing media, such that the pack and unpack commands can be interrupted with an unpack command.

17. The method of claim 16 wherein receiving the unpack command at the controller further comprises:

performing a test on the semiconductor devices after the tape packing media has been sealed; and generating the unpack command in response to the test.

\* \* \* \* \*

UNITED STATES PATENT AND TRADEMARK OFFICE
CERTIFICATE OF CORRECTION

PATENT NO. : 6,151,864
DATED : November, 28, 2000
INVENTOR(S) : Han Chin Fong and Sua Jit Sim It is certified that error appears in the above-identified patent and that said Letters Patent is hereby corrected as shown below:

Column 12,
Line 45, delete "lacing", insert --placing--.

Column 14,
Line 21, delete "tae", insert --tape--.

Signed and Sealed this

Twenty-fourth Day of July, 2001

Attest:

*Nicholas P. Godici*

NICHOLAS P. GODICI
*Attesting Officer*   *Acting Director of the United States Patent and Trademark Office*